United States Patent
Shimoda et al.

(10) Patent No.: US 6,696,785 B2
(45) Date of Patent: Feb. 24, 2004

(54) ORGANIC EL DISPLAY AND MANUFACTURING METHOD THEREOF, MULTI-HOLED SUBSTRATE, ELECTRO-OPTIC DEVICE AND MANUFACTURING METHOD THEREOF, AND ELECTRONIC DEVICE

(75) Inventors: Tatsuya Shimoda, Nagano-ken (JP); Satoru Miyashita, Chino (JP); Satoshi Inoue, Nagano (JP)

(73) Assignee: Seiko Epson Corporation (JP)

( * ) Notice: Subject to any disclaimer, the term of this patent is extended or adjusted under 35 U.S.C. 154(b) by 84 days.

(21) Appl. No.: 09/900,520

(22) Filed: Jul. 6, 2001

(65) Prior Publication Data

US 2002/0041149 A1 Apr. 11, 2002

(30) Foreign Application Priority Data

Jul. 7, 2000 (JP) .................................... P2000-207391
Jul. 3, 2001 (JP) .................................... P2001-201710

(51) Int. Cl.⁷ .............................. H01J 1/62; H01J 63/04
(52) U.S. Cl. ..................................................... 313/504
(58) Field of Search ................................ 313/504, 506, 313/500; 315/169.3, 45, 76, 55; 428/917

(56) References Cited

U.S. PATENT DOCUMENTS

| 3,619,714 | A | * | 11/1971 | Evans et al. ................ 315/109 |
| 5,545,291 | A | | 8/1996 | Smith et al. |
| 5,783,856 | A | | 7/1998 | Smith et al. |
| 5,824,186 | A | | 10/1998 | Smith et al. |
| 5,904,545 | A | | 5/1999 | Smith et al. |
| 6,194,837 | B1 | * | 2/2001 | Ozawa ..................... 315/169.1 |

* cited by examiner

Primary Examiner—Sandra O'Shea
Assistant Examiner—Sumati Krishnan
(74) Attorney, Agent, or Firm—Harness, Dickey & Pierce, P.L.C.

(57) ABSTRACT

An object is to efficiently manufacture an organic EL display which uses microstructures. Microstructures are inlaid in a plurality of concavities in the surface of a nonconductive multi-holed substrate. On the multi-holed substrate, besides the concavities there is formed a plurality of through holes. The surface of the multi-holed substrate is covered with a nonconductive protective film. A transparent substrate on the surface of which is formed beforehand a transparent electrode layer is prepared, and the transparent substrate is attached to the rear face side of the multi-holed substrate. Contact holes are formed after which a luminous layer is formed inside the through holes by an ink jet method. The surface of the multi-holed substrate including the inside of the contact holes is covered with a metallic layer such as aluminum, and the metallic layer is then patterned, and negative electrodes and wiring are formed.

5 Claims, 5 Drawing Sheets

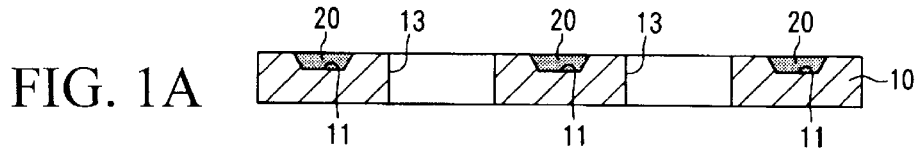
FIG. 1A
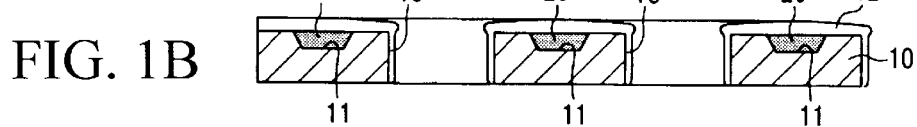
FIG. 1B
FIG. 1C
FIG. 1D
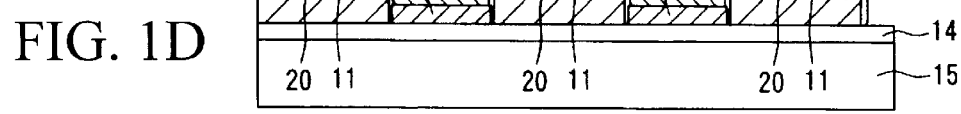
FIG. 1E
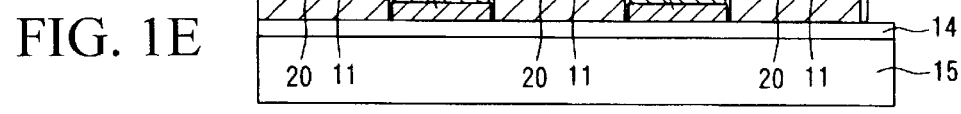
FIG. 1F
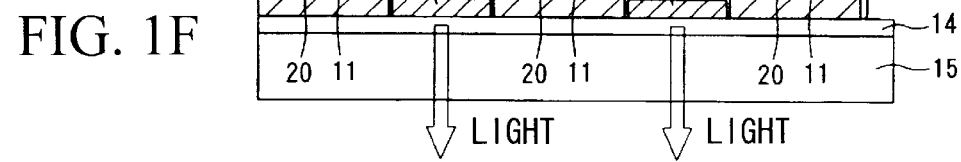

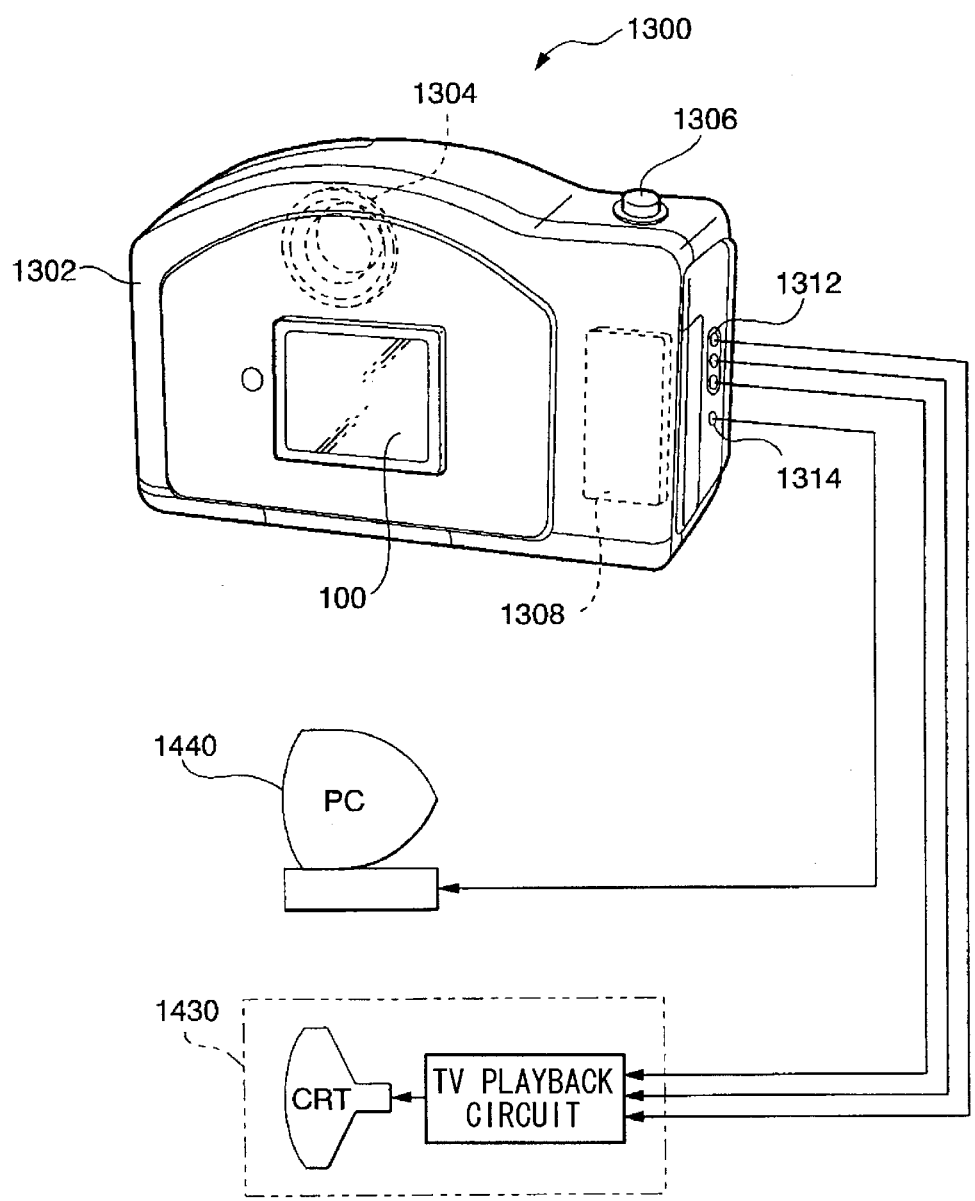

ORGANIC EL DISPLAY AND MANUFACTURING METHOD THEREOF, MULTI-HOLED SUBSTRATE, ELECTRO-OPTIC DEVICE AND MANUFACTURING METHOD THEREOF, AND ELECTRONIC DEVICE

BACKGROUND OF THE INVENTION

1. Field of the Invention

The present invention relates to an organic electroluminescence (hereunder EL for short) display and a manufacturing method thereof, and to a multi-holed substrate ideally used therein. In particular the invention is one where, in a display incorporating microstructures made with drive circuits for organic EL elements, and a manufacturing method thereof, the organic EL display can be manufactured extremely efficiently.

2. Description of Related Art

Heretofore, there is a method of manufacturing an electronic device using microstructures made with electronic circuit elements (refer for example to U.S. Pat. Nos. 5,904,545, 5,824,186, 5,783,856, and 5,545,291).

That is, there is a manufacturing method which uses microstructures, and which enjoys for example the advantage that even with a configuration where a plurality of electronic circuits are scattered over a substrate of an electronic device, the semiconductor material need not be wasted.

Therefore, the present inventors and others, as a result of earnest research, have completed a manufacturing method for obtaining an organic EL display involving firstly, making a drive circuit for an organic EL element within a microstructure and arranging this on a transparent substrate, and then performing in sequence; a wiring forming step, a transparent electrode forming step, a luminous layer forming step and a negative electrode forming step. However while undoubtedly it has been shown that the organic EL display can be manufactured while enjoying the advantages from such a microstructure, in practice in order to mass produce the organic EL display with a profit base, further improvement is desired.

BRIEF SUMMARY OF THE INVENTION

The present invention has resulted due to such requirements, with the object of providing a construction and manufacturing method for an organic EL display whereby an organic EL display can be manufactured extremely efficiently.

In order to achieve the above object, a first aspect of the present invention is a display which uses an organic EL element as pixels, wherein a nonconductive multi-holed substrate having; a plurality of concavities in which are inlaid a plurality of microstructures made with drive circuits for the organic EL element, and through holes which pass through between front and rear faces at formation positions of the pixels is used, and a luminous layer containing an organic EL layer is formed inside the through holes of the multi-holed substrate.

A second aspect of the present invention is that in the organic EL display being the first aspect, chamfering is given to a surface side edge portion of the through holes of the multi-holed substrate.

In order to achieve the above object, a third aspect of the present invention is a manufacturing method for a display which uses an organic EL element as pixels, involving using a nonconductive multi-holed substrate having; a plurality of concavities in which are inlaid a plurality of microstructures made with drive circuits for the organic EL element, and through holes which pass through between front and rear faces at formation positions of the pixels, and forming a luminous layer containing an organic EL layer inside the through holes of the multi-holed substrate.

In order to achieve the above object, a fourth aspect of the present invention is a manufacturing method for a display which uses an organic EL element as pixels, involving using a nonconductive multi-holed substrate having; a plurality of concavities in which are inlaid a plurality of microstructures made with drive circuits for the organic EL element, and through holes which pass through between front and rear faces at formation positions of the pixels, and providing: a microstructructure inlaying step for inlaying the microstructures in the concavities of the multi-holed substrate and then covering with a nonconductive protective film; a transparent electrode layer and transparent substrate forming step for providing in sequence a transparent electrode layer and a nonconductive transparent substrate on a rear face side of the multi-holed substrate; a luminous layer forming step for forming a luminous layer containing an organic EL layer inside the through holes of the multi-holed substrate provided with the transparent electrode layer; and a negative electrode and wiring forming step for forming a negative electrode and wiring on a surface of the multi-holed substrate formed with the luminous layer.

A fifth aspect of the present invention is that in the manufacturing method for an organic EL display according to the third or fourth aspects, chamfering is given to a surface side edge of the through holes of the multi-holed substrate.

Furthermore, a sixth aspect of the present invention is that in the manufacturing method for an EL display of the fourth or fifth aspects, in the transparent electrode layer and transparent substrate forming step, the transparent electrode layer is provided beforehand on the surface of the transparent substrate, and the transparent substrate is attached to a rear face side of the multi-holed substrate with the transparent electrode layer on an inside.

Furthermore, a seventh aspect of the present invention is that in the manufacturing method for an organic EL display according to any one of the fourth through sixth aspects, in the luminous layer forming step, the luminous layer is formed using an ink jet method.

Moreover, an eighth aspect of the present invention is that in the manufacturing method for an organic EL display according to any one of the fourth through seventh aspects, in the negative electrode and wiring forming step, the negative electrode and the wiring are formed separately.

On the other hand, a ninth aspect of the present invention is that in the manufacturing method for an organic EL display according to any one of the fourth through seventh aspects, in the negative electrode and wiring forming step, a surface of the multi-holed substrate on which the luminous layer is formed is covered with a metallic layer, and the metallic layer is patterned to form the negative electrode and the wiring at the same time.

A tenth aspect of the present invention is that in the manufacturing method for an organic EL display according to the ninth aspect, after the transparent electrode layer and transparent substrate forming step, and before the luminous layer forming step, there is provided a contact hole forming step for forming on the protective film contact holes which pass to electrode pads provided on the surface of the microstructures.

An eleventh aspect of the present invention is that in the manufacturing method for an organic EL display according to any one of the fourth through tenth aspects, in the microstructure inlaying step, the microstructure is inlaid in the concavity while in a liquid.

On the other hand, a twelfth aspect of the present invention is a multi-holed substrate used in a display which uses an organic EL element as pixels, comprising a material with nonconductivity, and wherein a plurality of concavities in which are inlaid a plurality of microstructures made with drive circuits for the organic EL element is provided on a surface, and through holes which pass through between front and rear faces are provided at formation positions of the pixels.

A thirteenth aspect of the present invention is that in the multi-holed substrate being the twelfth aspect, chamfering is given to a surface side edge portion of the through holes of the multi-holed substrate.

A fourteenth aspect of the present invention is an electro-optic device which uses a luminous element as pixels, wherein a multi-holed substrate having; a plurality of concavities in which are inlaid a plurality of microstructures made with drive circuits for the luminous element, and through holes which pass through between front and rear faces at formation positions of the pixels is used, and a luminous layer is formed inside the through holes of the multi-holed substrate.

A fifteenth aspect of the present invention is a manufacturing method for an electro-optic device which uses a luminous element as pixels, involving using a multi-holed substrate having; a plurality of concavities in which are inlaid a plurality of microstructures made with drive circuits for the luminous element, and through holes which pass through between front and rear faces at formation positions of the pixels, and forming a luminous layer inside the through holes of the multi-holed substrate.

A sixteenth aspect of the present invention is that the electro-optic device of the fourteenth aspect is provided.

According to the organic EL display and manufacturing method thereof according to the present invention, since a multi-holed substrate formed with through holes is used, the manufacturing process is simplified, with the effect that a reduction in manufacturing cost is possible.

Moreover, with the multi-holed substrate according to the present invention, an ideal multi-holed substrate is provided for the organic EL display and the manufacturing method thereof according to the present invention.

BRIEF DESCRIPTION OF THE SEVERAL VIEWS OF THE DRAWINGS

FIG. 1A to FIG. 1F are cross-sectional views showing manufacturing steps of a first embodiment.

FIG. 7 is a perspective view illustrating a construction of a rear face side of a digital still camera being an example of an electronic device.

DETAILED DESCRIPTION OF THE INVENTION

Hereunder is a description of embodiments of the present invention based on the drawings.

FIG. 1A to FIG. 1F, FIG. 2 and FIG. 3 are diagrams illustrating a first embodiment of the present invention, FIG. 1A to FIG. 1F being cross-sectional views showing manufacturing steps of an organic EL display.

That is, as shown in FIG. 1A, on the surface of a nonconductive multi-holed substrate 10 comprising a synthetic resin or the like of a thickness of around 100 $\mu$m, a plurality of microstructures 20 are inlaid in proximity to locations where pixels are subsequently formed. Inside the microstructures 20 is formed a plurality of electrode pads (not shown in the figure) for electrical connection with an external power supply or the like.

Figure 2:
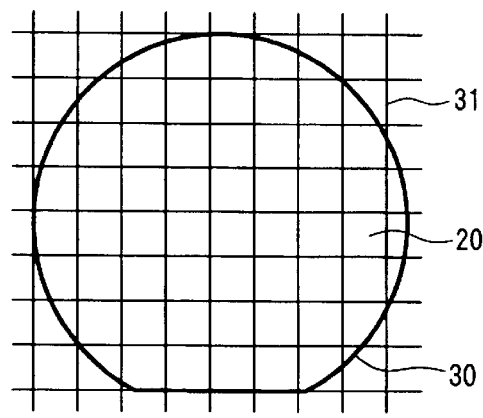
FIG. 2 is an explanatory diagram of a manufacturing method of a microstructure.

The manufacturing method itself for the microstructures 20, and the method of inlaying these in the multi-holed substrate 10 is detailed in U.S. Pat. Nos. 5,904,545, 5,824,186, 5,783,856, and 5,545,291, and is described briefly here. At first, as shown in FIG. 2, drive circuits comprising transistors, wiring and so forth are multiply formed on a semiconductor wafer 30 using a known photolithography process. Then the rear face is polished to give a predetermined thickness, after which the semiconductor wafer 30 is separated into individual microstructures 20 by dividing up along dividing lines 31.

Figure 3:
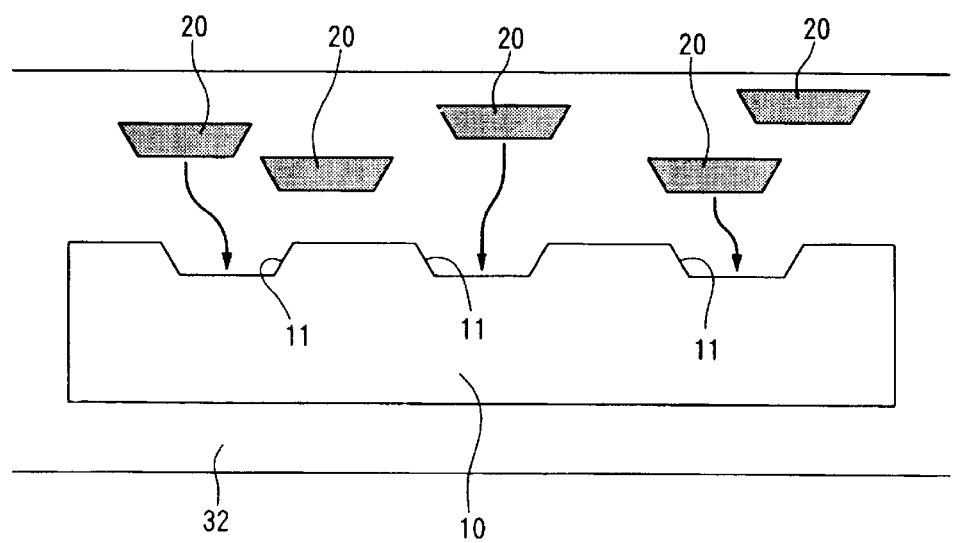
FIG. 3 is an explanatory diagram of a process for capturing microstructures in a transparent substrate.

Next, as shown in FIG. 3, a multi-holed substrate 10 with concavities 11 formed by a press or the like to a shape capable of engagement with the rear face shape of the microstructures 20 is placed in a liquid 32 with an upper surface thereof directed upwards, and a plurality of microstructures 20 are moved in the liquid 32 so as to follow along the upper surface of the multi-holed substrate 10, to thereby capture the microstructures 20 in the concavities 11. Once capture of the microstructures 20 is complete, in order to prevent the microstructures 20 from coming out, then as shown in FIG. 1B, the surface of the multi-holed substrate 10 is covered with a nonconductive protective film 12 (microstructure inlaying step).

In the multi-holed substrate 10, besides the concavities 11 there is formed a plurality of through holes 13 passing through the front and rear surfaces thereof. The formation position of the through holes 13 is the formation position of the pixels of the organic EL display, and the planar shape thereof becomes a shape which is one size larger than the desired pixel. The protective film 12 is also be adhered to the inside of the through holes 13.

Next, as shown in FIG. 1C a glass or synthetic resin transparent substrate 15 on the surface of which is formed beforehand a transparent electrode (ITO electrode) layer 14 is prepared, and the transparent substrate 15 is attached to the rear face side of the multi-holed substrate 10 so that the transparent electrode layer 14 is on the inside (transparent electrode and transparent substrate forming step). By so doing, the transparent electrode layer 14 faces the bottom part of the through holes 13.

Then, as shown in FIG. 1D, the protective film 12 is partially opened by a known photolithography process to form contact holes 16 passing to electrode pads of the microstructures 20 (contact hole forming step). Moreover, after subjecting to a required water-repellent process and hydrophilic process, an operation for spreading a liquid state material as a pixel forming region by an ink jet method from above the through holes 13 towards the bottom, and then drying this is repeated to thereby form a luminous layer 43 comprising a positive hole injection layer 41 and an organic EL layer 42 inside the through holes 13 (luminous layer forming step). Even though the material is selectively spread on the through holes 13 by the ink jet method, the point that the print positional accuracy is extremely high with current ink jet methods, and the point that outflow of the material is prevented by the through hole 13 itself, ensures that the formation position of the luminous layer 43 can be controlled to a high accuracy.

Then, as shown in FIG. 1E, the surface of the multi-holed substrate 10 including the inside of the contact holes 16 is covered with a metallic layer 17 such as aluminum by an evaporation method or a sputtering technique. Furthermore, the metallic layer 17 is patterned by a known photolithography process, and as shown in FIG. 1F, negative electrodes 18 and wiring 19 are formed at the same time (negative electrode and wiring forming step).

Accordingly, supply of current to the luminous layer 43 becomes possible, and the light emitted therefrom, as shown in FIG. 1F, passes through the transparent electrode layer 14 and the transparent substrate 15 and is shone to the outside from the rear face side of the transparent substrate 15. Therefore, the rear face side of the transparent substrate 15 becomes the screen of the organic EL display.

In this manner, in the present embodiment, an organic EL display which uses the microstructures 20 can be manufactured.

Moreover, in the present embodiment, since the organic EL display is manufactured using the multi-holed substrate 10 formed with the through holes 13, then compared to the conventional manufacturing process for the organic EL display where the luminous layer is formed while creating banks or the like on the transparent substrate, the manufacturing process is simplified, with the effect that a reduction in manufacturing cost is possible.

Furthermore, according to the present embodiment, since there is no wiring or electronic circuits and the like beneath (on the transparent substrate 15 side) the through holes 13 being the pixel forming region, then as well as improving the numerical aperture of each pixel, this gives an extremely advantageous construction.

In the present embodiment, by forming the negative electrodes 18 and the wiring 19 at the same time, the number of steps is reduced. However forming these at the same time is not essential to the present invention, and these may be formed in separate steps.

Figure 4:
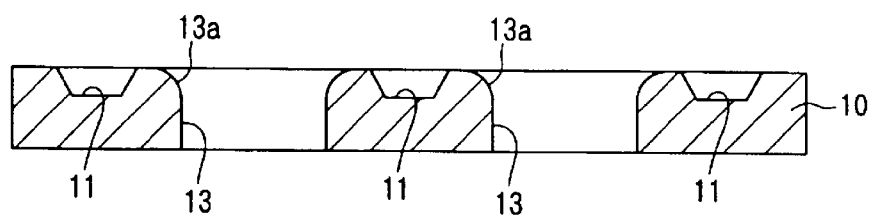
FIG. 4 is a cross-sectional view showing the construction of a multi-holed substrate of a second embodiment.

FIG. 4 is a diagram illustrating a second embodiment of the present invention, being a cross-sectional view showing the construction of a multi-holed substrate 10. The shape of the multi-holed substrate 10, with the exception of the different parts, is the same as for the first embodiment, and a diagram and explanation for the manufacturing method of the organic EL display is omitted.

That is, with the present embodiment, by chamfering the edge portion (angled portion) of the surface side (the side formed with the concavities 11) of the through holes 13, a taper portion 13a is formed at the chamfer. With such a configuration, in the case where construction is performed by steps such as shown in FIG. 1A to FIG. 1F, the possibility of the metallic layer 17 being severed at the angled portion of the through holes 13 can be greatly reduced. Hence there is an advantage such as an increase in yield.

In the above embodiment, the description has been given for an organic EL display as one example of an electro-optic device. However the present invention where microstructures formed with drive circuits are positioned in concavities on a substrate, may, other than the organic EL substrate, also be applied to electro-optic devices of the self luminescent type such as plasma displays.

<Electronic Devices>

Next is a description of several examples where the organic EL display as one example of the abovementioned electro-optic device, is used in specific electronic devices.

<First Example: Mobile Type Computer>

Figure 5:
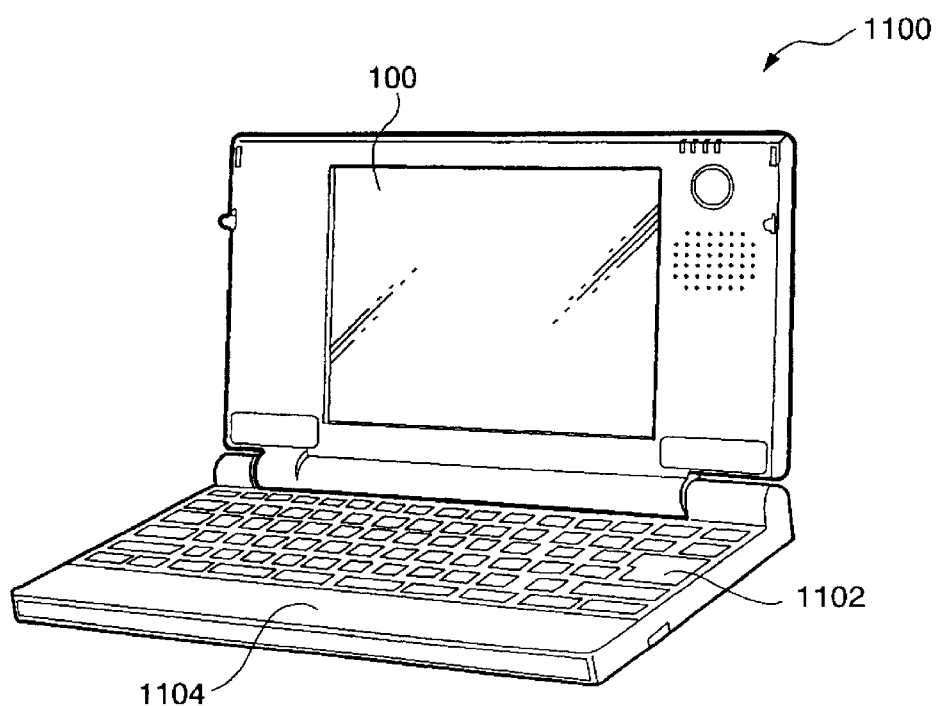
FIG. 5 is a perspective view illustrating a construction of a personal computer being an example of an electronic device of the present invention.

At first is a description of an example for where an organic EL display according to the embodiments is applied to a mobile type personal computer. FIG. 5 is a perspective view illustrating the construction of this personal computer. In the figure, a personal computer 1100 comprises a main frame 1104 incorporating a key board 1102, and a display unit 1106. The display unit 1106 has an organic EL display panel 100.

<Second Example: Portable Telephone>

Figure 6:
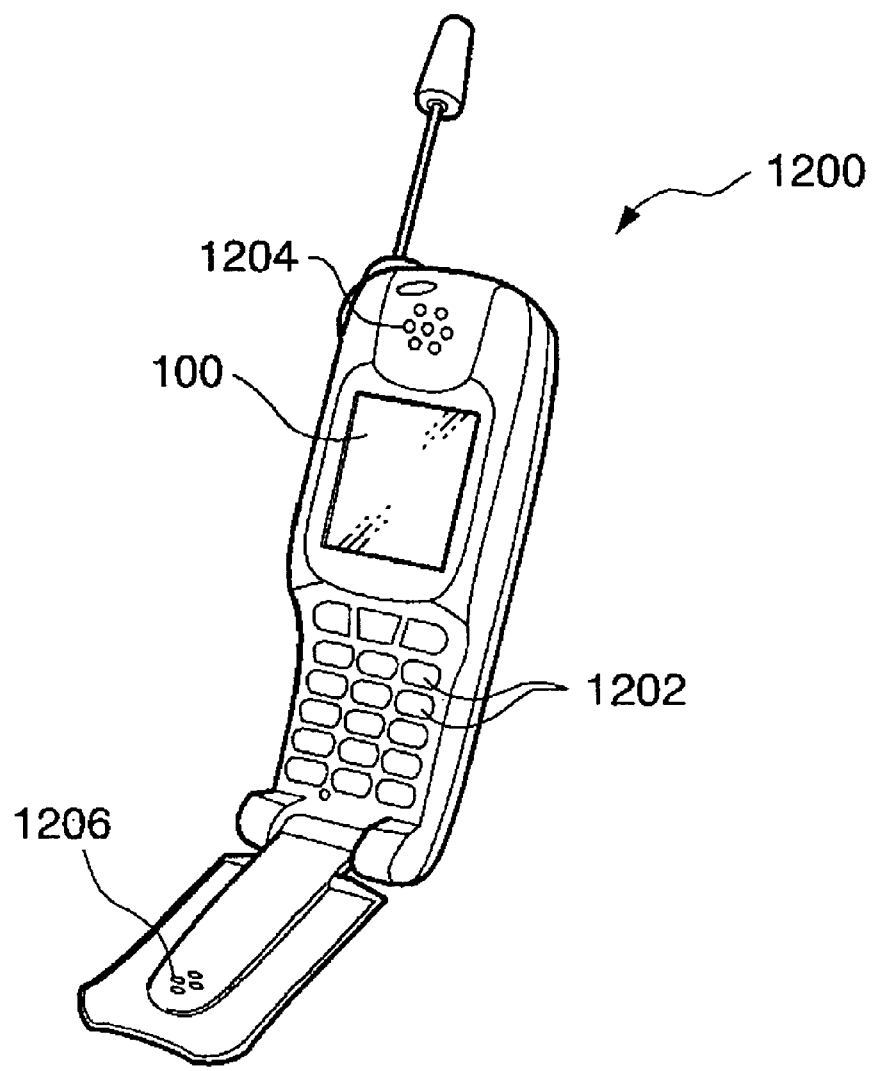
FIG. 6 is a perspective view illustrating a construction of a portable telephone being an example of an electronic device.

Next is a description of an example for where an organic EL display is applied to a display section of a mobile telephone. FIG. 6 is a perspective view illustrating the construction of this mobile telephone. In the figure, a mobile telephone 1200 incorporates a plurality of operating buttons 1202 as well as, an earpiece 1204, a mouth piece 1206 and the abovementioned organic EL display panel 100.

<Third Example: Digital Still Camera>

Next is a description of a digital still camera which uses an organic EL display in a finder. FIG. 7 is perspective view illustrating the construction of this digital still camera, with connections for external equipment also shown simplified.

In contrast to a normal camera where the film is exposed by an optical image of a photographic subject, with the digital still camera 1300, the optical image of the photographic subject is photoelectrically converted by an imaging element such as a CCD (charged coupled device) to thereby produce an image signal. Here, the construction is such that the abovementioned organic EL display panel 100 is provided on a back face of a case 1302 of the digital still camera 1300, and display is performed based on the image signal from the CCD. Therefore the organic EL display panel 100 functions as a finder for displaying the photographic subject. Furthermore, on the viewing side (the rear face side in the figure) of the case 1302 there is provided a light receiving unit 1304 which includes an optical lens and a CCD or the like.

Here, when the photographer has confirmed the subject image displayed on the organic EL display panel 100 and pushes a shutter button 1306, the image signal from the CCD at that point in time is sent to a memory of a circuit substrate 1308 and stored therein. Furthermore, in this digital still camera 1300, on the side face of the case 1302 there is provided a video signal output terminal 1312 and an input-output terminal 1314 for data communication. Moreover, as shown in the figure, as required, a television monitor 1430 is connected to the former video signal output terminal 1312, or a personal computer 1430 is connected to the later data communication input-output terminal 1314. Furthermore, the construction is such that by a predetermined operation, the imaging signal stored in the memory of the circuit substrate 1308 is output to the television monitor 1430 or the personal computer 1440.

For the electronic device, in addition to the personal computer of FIG. 5, the mobile telephone of FIG. 6, or the digital still camera of FIG. 7, there can be given devices such as a liquid crystal display, a view finder type or direct view monitor type video recorder, a car navigation unit, a pager, an electronic notebook, an electronic calculator, a word processor, a work station, a video phone, a POS terminal, a device furnished with a touch panel and so on. Moreover, needless to say for the display section of these various electronic devices, the abovementioned display device can be applied.

What is claimed is:

1. An organic EL display which uses an organic EL element as pixels comprising:
    a nonconductive multi-holed substrate having front and rear faces;
    a plurality of concavities in said multi-holed substrate;
    a plurality of microstructures made with drive circuits for said organic EL element, said plurality of microstructures being inlaid in said plurality of concavities;
    through holes in said multi-holed substrate passing through said multi-holed substrate between said front and rear faces, said through holes being located at formation positions where said pixels are used; and
    a luminous layer containing an organic EL layer, said luminous layer being inside said through holes of said multi-holed substrate.

2. The organic EL display according to claim 1, wherein a surface side edge portion of said through holes of said multi-holed substrate is chamfered.

3. A multi-holed substrate used in a display which uses an organic EL element as pixels comprising:
    a nonconductive material having front and rear faces;
    a plurality of concavities in one of said faces of said material;
    a plurality of microstructures made with drive circuits for said organic EL element, said plurality of microstructures being inlaid in said plurality of concavities; and
    a plurality of through holes in said material which pass through said material between said front and rear faces, said through holes being provided in said material at formation positions of said pixels.

4. The multi-holed substrate according to claim 3, wherein a surface side edge portion of said through holes of said material is chamfered.

5. An electro-optic device which uses a luminous element as pixels comprising:
    a multi-holed substrate having front and rear faces;
    a plurality of concavities in said multi-holed substrate;
    a plurality of microstructures made with drive circuits for said luminous element, said microstructures being inlaid in said concavities;
    through holes in said multi-holed substrate which pass through said multi-holed substrate between said front and rear faces, said through holes being located at formation positions where said pixels are used; and
    a luminous layer inside said through holes of said multi-holed substrate.

* * * * *

UNITED STATES PATENT AND TRADEMARK OFFICE
CERTIFICATE OF CORRECTION

PATENT NO. : 6,696,785 B2
DATED : February 24, 2004
INVENTOR(S) : Shimoda et al.

It is certified that error appears in the above-identified patent and that said Letters Patent is hereby corrected as shown below:

<u>Title page,</u>
Item [75], Inventors, Shimoda "Nagano-ken" should be -- Fujimi-cho -- Inoue "Nagano" should be -- Chino-shi --

Signed and Sealed this

Thirteenth Day of July, 2004

JON W. DUDAS
*Acting Director of the United States Patent and Trademark Office*